(12) United States Patent
Fujikawa et al.

(10) Patent No.: US 6,261,362 B1
(45) Date of Patent: Jul. 17, 2001

(54) SILICON EPITAXIAL WAFER MANUFACTURING METHOD

(75) Inventors: Takashi Fujikawa, Kashima; Masaharu Ninomiya, Saga Prefecture, both of (JP)

(73) Assignee: Sumitomo Metal Industries, Ltd., Osaka (JP)

( * ) Notice: Subject to any disclaimer, the term of this patent is extended or adjusted under 35 U.S.C. 154(b) by 0 days.

(21) Appl. No.: 09/395,960

(22) Filed: Sep. 14, 1999

(30) Foreign Application Priority Data

Sep. 14, 1998 (JP) .................................................. 10-259917

(51) Int. Cl.[7] .................................................. C30B 15/20
(52) U.S. Cl. .................................................. 117/20; 117/19
(58) Field of Search ................... 117/13, 19, 20

(56) References Cited

U.S. PATENT DOCUMENTS 5,096,839 * 3/1992 Amai et al. .
6,048,395 * 4/2000 Iida et al. .................................. 117/20
6,066,306 * 5/2000 Iida et al. .................................. 423/328.1

* cited by examiner

Primary Examiner—Felisa Hiteshew
(74) Attorney, Agent, or Firm—Breiner & Breiner

(57) ABSTRACT

The objective of this invention is to provide a manufacturing method wherewith optimally low-COP substrates can be efficiently manufactured for epitaxial wafers in order to obtain high epitaxial surface quality that will not have an adverse effect on device characteristics. A phenomenon was discovered whereby COPs are eliminated by solution annealing or flattening when epitaxial films are formed on wafers wherein the density of grown-in defects (COPs) with a size of 0.130 μm or larger is 0.03 defects/cm$^2$ or lower, the use of which phenomenon is characteristic of the invention. For example, by pulling a monocrystal while deliberately controlling the carbon concentration therein to within a prescribed high range, and employing wafers cut from silicon monocrystal ingots grown with a pulling speed wherewith no OSF-ring outer region is present in the wafer surface, wafers having the low COP densities noted above are obtained, and the COPs are eliminated by solution-annealing or flattening when forming the epitaxial film, wherefore high-quality epitaxial wafers can be manufactured with good yield.

5 Claims, 5 Drawing Sheets

SILICON EPITAXIAL WAFER MANUFACTURING METHOD

FIELD OF THE INVENTION

This invention relates to a method of manufacturing silicon epitaxial wafers having a silicon epitaxial film vapor-grown on a prescribed surface, for use as materials for highly integrated semiconductor devices, and to improvements in a manufacturing method therefor with the object of reducing defects called light point defects (LPDs) that occur in the surface thereof.

The present invention relates to a silicon epitaxial wafer manufacturing method wherein, using a CZ method or MCZ method (hereinafter referred to as the CZ method) that utilizes the fact that, whereas the COP (Crystal-originated particles) density is high in wafers wherein the carbon content has deliberately been made high, the size thereof is small, and, when growing the epitaxial film, wafers are solution-annealed or flattened to eliminate COPs, whereby the carbon concentration in the monocrystals is controlled so that it is made deliberately high, within a prescribed range, and silicon monocrystalline ingots are grown with a comparatively high pulling speed, wherefrom selection is made so that the grown-in defect density in the wafer surface is 0.03 defects/cm$^2$ or lower with a size of 0.130 µm or greater, whereupon, using these selected wafers, the epitaxial film is formed, whereby the silicon epitaxial wafers grown are compatible with extremely high-quality next-generation high-integration devices.

DESCRIPTION OF THE PRIOR ART

In conventional semiconductor devices (equivalent to 4M and 16M devices), a design rule has generally been used involving a line width broader than 0.35 µm or so. It is said that the grown-in defects (COPs=crystal-originated particles) of a size ⅔ or more of this line-width size affect the actual device characteristics. This critical COP size value is sometimes deemed to be ½ by device manufacturers taking a stricter view.

Conventionally, to be more specific, although the COP size deemed to affect the devices differs somewhat depending on the device manufacturer and device application, COPs smaller than 0.233 µm (or smaller than 0.175 µm if the stricter view is taken) present on the wafer surface (such as in a density of 0.3 COPs/cm$^2$ of a size of 0.20 µm, for example) are not believed to have all that much effect on device characteristics or final yield, and hence have not been considered problematic.

However, with further advances toward finer design rules in next-generation highly integrated devices, the very small, low-density COPs present on the surfaces of devices previously considered non-problematic are now definitely known to have adverse effects on device characteristics, so that the reduction of these COPs is considered absolutely indispensable to obtaining good final device production yield.

Conventionally, efforts to resolve this problem in wafers considered comparable to 4M and 16M devices have been focused on improving the growth process at the time of crystal lifting. A representative example of such an improvement approach that has been employed involves pulling the crystals at a considerably slower pulling speed than was previously used. These methods have been employed wherein the pulling speed is reduced by 30% to 60%.

It is known that when wafers cut from crystals made by pulling at such low speeds are subjected to a thermal oxidation process at 1000° C. to 1150° C., a ring-shaped oxidation-inducing lamination defect called an oxidation-induced stacking fault (OSF) develops.

Furthermore, when the pulling speed is slowed down even further, the OSF ring contracts further until, ultimately, it disappears at the center of the wafer. As a result, the COP density is reduced over the entire surface of the wafer.

In other words, with the prior art, efforts to reduce COP occurrence density have focussed on slowing down the crystal pulling speed.

However, when this pulling speed is slowed down, a problem arises in that the pulling time is lengthened, whereupon the danger of dislocations developing is heightened. The development of such dislocations induces a decline in crystal pulling yield.

Another problem with crystals pulled at low speed is that productivity becomes significantly poorer than when the crystals are pulled at high speed. This results in a higher-cost manufacturing method than that of producing crystals by high-speed pulling.

It is now apparent that the design rule will be diminished to 0.25 µm in coming high-density devices (equivalent to 256M and 1G and beyond), and further diminished to 0.18 µm in the near future, whereupon it has become necessary to study COPs of an even smaller size, down to the 0.09 µm level when viewed in terms of the design rule severity discussed earlier.

However, it will be extremely difficult to achieve further COP reduction with the conventionally employed techniques, that is, with improvements involving modifications in crystal pulling conditions. As noted already, moreover, in terms of cost, the conventional low-speed pulling method is particularly problematic.

In view of what has been said, in devices having high integration levels of 256M or more, there is a strong possibility that epitaxial wafers will be used for device substrates instead of mirror-finished wafers cut from crystals produced using modified crystal pulling methods.

That is, compared with the mirror-finished wafers, in epitaxial wafers there exist few if any grown-in defects in the epitaxial layer which would cause device characteristics to deteriorate, wherefore it is possible to obtain extremely high surface quality.

To date, epitaxial wafers have not been used very extensively due to their higher cost as compared with mirror-finished wafers. Nevertheless, unless the COP problem associated with methods based on modified crystal pulling conditions can be overcome, it is believed that the epitaxial wafer will come to be the wafer of choice for highly integrated device substrates.

However, even if high-quality epitaxial wafers are adopted, there is a danger that, depending on the quality of the substrate wafer used as the base layer therefor, defects will develop, on the epitaxial surfaces grown, that will adversely affect device characteristics, thereby nullifying the expectation for the high-quality surface conditions considered the primary merit of the epitaxial wafer.

That is, in wafers cut from crystals pulled at low speed, among these COPs are some which continue to exist without flattening or disappearing even when subjected to an etching action in an atmosphere of hydrogen and hydrogen chloride during the epitaxial growth process. Hence COP-induced defects (LPDs) develop in the epitaxial layer surface.

Dislocation clusters readily develop in wafers cut from crystals pulled at low speed. Accordingly, when dislocation clusters are present on the wafer surface, even though an epitaxial growth process is performed, the dislocation clusters do not disappear, but appear just as they are on the growth surface, causing a significant decline in the epitaxial surface quality, which is a problem.

In other words, with improved methods based on the modified crystal pulling speed described earlier, problems remain in terms of productivity, cost, production yield, and surface quality perfection as represented by COPs.

SUMMARY OF THE INVENTION

An objective of the present invention is to provide a manufacturing method capable of producing high-quality epitaxial wafers at high yield, wherewith it is possible to efficiently manufacture ideal low-COP substrates for the epitaxial wafers in order to obtain, in the described epitaxial wafers, high epitaxial surface quality without adversely affecting device characteristics.

The inventors conducted various studies on wafers with the objective of efficiently manufacturing epitaxial wafers that exhibit extremely low COP generation volume in the epitaxial wafer surface and are suitable for use in manufacturing next-generation high-quality integrated devices.

As a result of these studies, the inventors learned that, in wafers made by low-speed pulling, the size of the COPs is large although the density thereof is low, and that, even when epitaxial films are formed thereon, the large-sized COPs remain as COPs without being solution-annealed or flattened. They also learned that, for the low-speed pulling method, when the carbon concentration is deliberately controlled to make it high, COP density is high but the size is small, and these COPs disappear when solution-annealed or flattened in the process of epitaxial film growth.

Thereupon, the inventors conducted a detailed study of the relationship between carbon concentration and pulling speed. As a result, the following things were learned.

1) When pulling crystals using a CZ method, in cases where the size is 8 inches or greater, if the pulling speed is less than 0.7 mm/min, an OSF ring develops in the wafer surface, in the outer region wherein dislocation clusters occur.

2) When the carbon concentration is deliberately controlled so that it is high, a COP-reduction effect is observed.

3) This COP reduction effect becomes pronounced at pulling speeds of 0.7 mm/min or greater.

Going further, the inventors conducted an exacting study on the interrelationships between the pulling speed, carbon concentration, COP size, and COP density as noted above.

As a result, the inventors learned that, by manufacturing with a manufacturing method inclusive of the processes listed below, epitaxial wafers can be fabricated that are suitable for use with extremely high-quality next-generation integrated devices, and thus perfected the present invention. Those processes are:

a process for growing silicon monocrystals while controlling the carbon concentration to keep it high, within a prescribed range, a process for growing silicon monocrystals, by, for example, using comparatively high-speed pulling, so that no outer region of the OSF ring exists in the wafer surface, a process for preparing a substrate for the epitaxial wafer, after it is grown, wherein the density of COPs with a size of 0.130 μm or larger is below a certain density, and a process for performing epitaxial growth on such wafers.

The inventors conducted various experiments and studies, which are described below, and thereby identified factors capable of controlling COP generation by the deliberate addition of carbon. The inventors also did a detailed study on the influence of the carbon concentration on COP generation in wafers before epitaxial growth.

As a result, the inventors learned the following things. Firstly, COP generation can be reduced and suppressed by, when performing the growing, adding carbon and controlling the carbon concentration within a range of $0.3 \times 10^{16}$ to $3.2 \times 10^{17}$ atoms/cm$^3$ (NEW ASTM). Secondly, and particularly, the generation of COPs of a size of 0.130 μm or greater, which are difficult to eliminate, even when wafers are made and epitaxial growth is performed, can thereafter be significantly reduced and suppressed. And, thirdly, COP generation can be reduced and suppressed without employing conventional low-speed pulling which leads to a decline in crystal productivity.

With the present invention, by deliberately adding suitable amounts of carbon (the admixture of which is ordinarily avoided at all cost), the generation of COPs above a certain size can be markedly suppressed, without reducing the pulling speed in the crystal growing process. Therefore, as compared with manufacturing methods employing conventional low-speed growth processes, it is possible to manufacture, at low cost, extremely low-COP crystals wherein no dislocation clusters occur.

In addition, by using the silicon crystals described earlier and after cutting wafers therefrom, measuring the wafer conditions and performing sorting, it is possible to predict which wafers will be good and which will be poor after epitaxial growth. By growing epitaxial films on those wafers whereon the generation of COPs above a certain size is below a certain level, COP-induced LPDs can be identified beforehand. Thus it becomes possible to manufacture even higher-quality epitaxial wafers so that the probability of yielding non-defective products is high.

DESCRIPTION OF THE PREFERRED EMBODIMENTS

Figure 1:
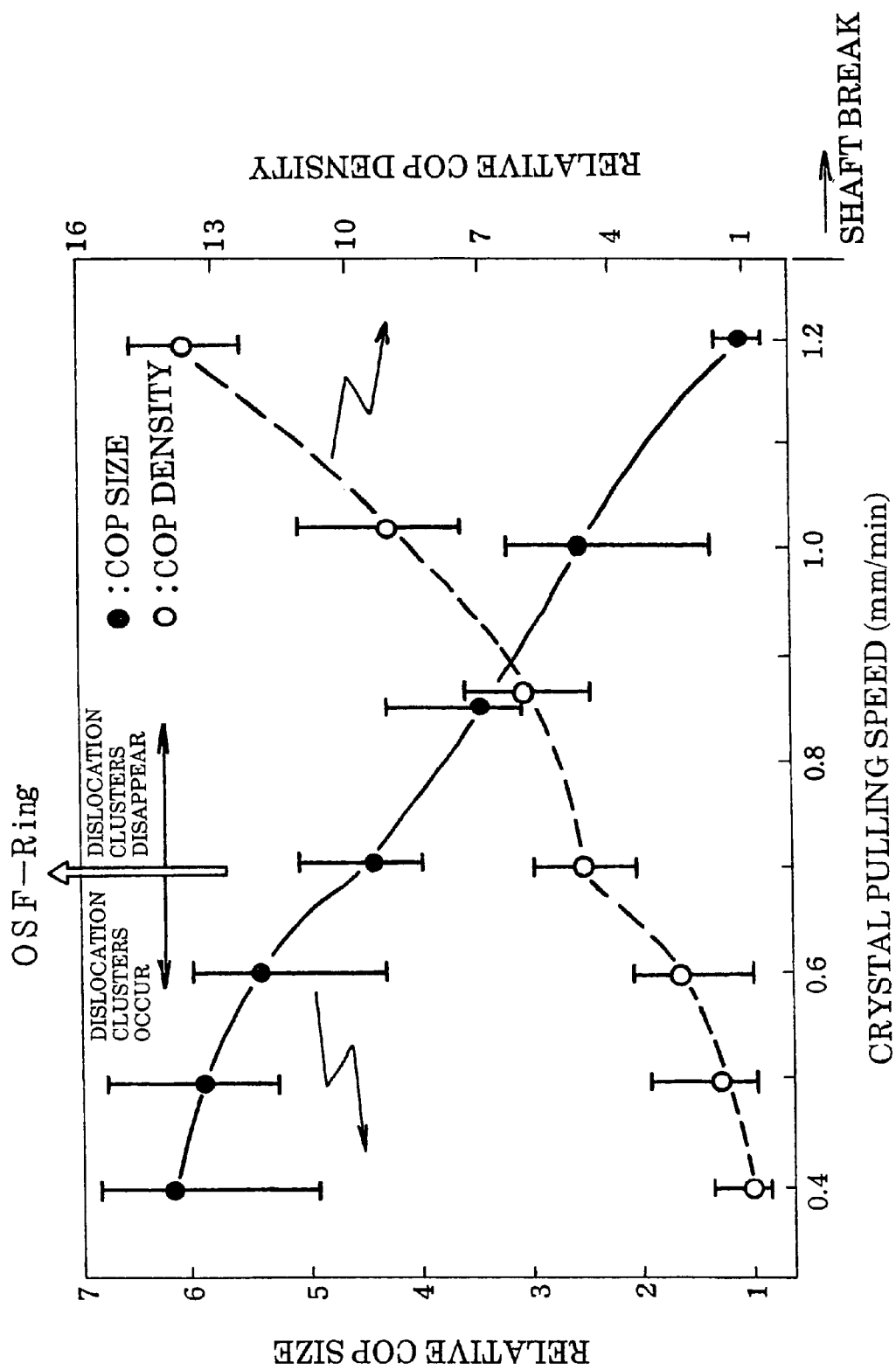
FIG. 1 is a graph plotting the relationship between COP size and COP density as dependent on crystal pulling speed.

The present invention is a silicon epitaxial wafer manufacturing method that is a process comprising, as appropriate, the following processes:

a process for deliberately adding carbon, and controlling the concentration thereof within a range of $0.3 \times 10^{16}$ to $3.2 \times 10^{17}$ atoms/cm$^3$ (NEW ASTM), using a known control method, when pulling and growing crystals by a known CZ method, and a process for, after cutting out the wafers, finishing one side or both sides thereof by polishing to a mirror finish, measuring the density of COPs with a size of 0.130 μm or larger, and selecting those wafers wherein that density is 0.03 COPs/cm² or lower.

In the present invention, the pulling speed when growing by the CZ method is made comparatively fast so that no outer region of the OSF ring will exist in the wafer surface. This is because dislocation clusters occur in the outer region of the OSF rings which occur on the surface, and they do not disappear subsequently even with epitaxial growth. When the diameter is 8 inches or greater, for example, outer regions develop for OSF rings in the wafer surface at pulling speeds of less than 0.7 mm/min, which is undesirable. At pulling speeds of 0.7 mm/min or higher, the COP reduction effect induced by the high carbon concentration becomes pronounced, which is desirable in terms of improved productivity. When the pulling speed is too fast, however, there is a danger of shaft break, wherefore 2.0 mm/min or lower is preferable, and 1.6 mm/min or lower is even more preferable.

The reason why COP generation is suppressed by the addition of carbon, and especially why the generation of COPs of a size of 0.130 μm or greater is particularly suppressed, is not yet known for certain, but is conjectured to be as follows. When the covalent radius of silicon atoms and the covalent radius of carbon atoms are compared against each other, the latter is found to be smaller by roughly 40%. For that reason, compression sites are produced in the silicon lattice by hydrogen or SiC formation, whereupon the inter-lattice silicon associated with the compression sites is absorbed and its density decreases. It is thought that perhaps the suppression of large COP generation is a result of this effect.

In the present invention, no COP suppression effect is observed at carbon concentrations of less than $0.3\times10^{16}$ atoms/cm³ (NEW ASTM), and, in the interest of COP suppression, a concentration of $1.0\times10^{17}$ atoms/cm³ or greater is preferred. As to the upper limit therefor, there is no particular problem in terms of quality at $3.2\times10^{17}$, which is the upper limit for a solid solution, but it is well known from experience that there is a high likelihood of causing dislocations to develop if the concentration is too high, wherefore it is preferable that the upper limit be made $8.0\times10^{16}$ atoms/cm³ or less, and a value of $5.0\times10^{16}$ atoms/cm³ or less is even more preferable.

In the present invention, in performing epitaxial growth, in addition to using wafers having the carbon concentrations noted in the foregoing, the wafers used are to exhibit a COP generation incidence per unit area, for COPs existing on the wafer in a size of 0.130 μm or greater, of 0.03/cm² or less.

The reason for this lies in the fact that COP suppression can be more greatly expected in wafers containing certain carbon concentrations, prior to epitaxial growth, than in wafers wherein the carbon content is below the limit of detectability. Also, due to the effect described earlier even if COPs larger than 0.130 μm occur in the wafer, the number thereof is extremely low, and does not rise to a level where problems arise in terms of device yield. Nevertheless, in the unlikely event that they develop in conjunction with disturbances and an epitaxial growth process is performed in such epitaxial wafers, good surface quality is not realized, as was demonstrated by the results of various experiments conducted by the inventors. The critical value is exceeded when the incidence of COPs larger than 0.130 μm rises above 0.03 COPs/cm².

In other words, insofar as COPs of small size are concerned, by conducting, thereafter, the epitaxial growth process, the surface is flattened by the etching action in an atmosphere of hydrogen and hydrogen chloride in a high temperature region during the process, as a consequence whereof almost all of the COPs disappear.

COPs of a large size, on the other hand, are very difficult to eliminate even when an epitaxial growth process is performed. Hence one must be concerned about COP-induced defect LPDs remaining on the surface even after epitaxial growth, and, consequently, there is a danger that even the good-quality epitaxial wafers cannot be shipped to device manufacturers.

Stated differently, the inventors discovered that final yield after epitaxial growth is greatly influenced by whether or not sorting is done using 0.03 COPs/cm² as the critical value for COPs having a size of 0.130 μm, after measuring the incidence density thereof prior to epitaxial growth.

Accordingly, by using crystals pulled while deliberately controlling the carbon concentration to within a prescribed range, and employing the process steps of measuring the density of COPs with a size of 0.130 μm or greater prior to epitaxial growth, and sorting according to a prescribed standard, it is possible to manufacture high-quality epitaxial wafers even when high-speed pulling is performed, either so that an OSF ring advantageous in the interest of productivity is produced at the outermost periphery of the crystal, or so that it disappears on the outside.

In the epitaxial wafer manufacturing method of the present invention, first, using a CZ process, the silicon monocrystal is pulled at a speed wherewith the OSF ring is either produced at the outermost periphery of the crystal so that it is not present in the wafer surface, or so that it disappears on the outside thereof. In the case of a crystal having a diameter of 8 inches or greater, for example, the pulling is done with a pulling speed of 0.7 mm/min or higher. Also, wafers are cut from silicon monocrystals to which, in the pulling process, carbon is added within a concentration range of $0.3\times10^{16}$ to $3.2\times10^{17}$ atoms/cm³.

Next, After cutting the wafers, a known surface grinding process and chemical polishing process are implemented in suitable combination, and the edges are subjected to grinding or chemical polishing, resulting finally in a polished mirror finish on either one side or both sides of the silicon wafer.

Finishing polishing is then performed and an epitaxial film is formed on the requisite surface or surfaces.

Conventionally, as noted earlier, every effort possible was employed to prevent the admixture of carbon in the silicon monocrystal during pulling. High carbon concentrations were viewed as problematic in that they resulted in a deterioration in perfection in the wafer surface and the regions near the surface, and in the degradation of various properties.

It has been confirmed, however, as is evident in the embodiments of the present invention, that if epitaxial growth is implemented, the carbon concentration has no adverse effect whatever even when it is high in the wafer.

Embodiment 1

When growing silicon monocrystals using a CZ method, boron (B) was added, and controls were imposed so that the substrate resistance value was 7~15 Ω·cm, the oxygen concentration was 12.5~14 ($\times10^{17}$ atoms/cm³), and the concentration of carbon (an impurity element) was below $0.1\times10^{16}$ atoms/cm³ corresponding to the lower limit of detectability. Also, during growing, the crystal pulling speed was variously altered within a range of 0.4 to 1.2 mm/min, yielding silicon monocrystals manufactured to an outer diameter of 8 inches.

Sample wafers cut respectively from prescribed positions in the 8-inch silicon monocrystals pulled at various speeds were subjected to surface grinding, and then to mirror-surface polishing on both sides to yield mirror-finish wafers. COP sizes and densities were measured for each wafer using a surface contamination inspection instrument (SP-1 made by KLA-Tencor). The results of these measurements are represented in the graph in FIG. 1 wherein the relationship between crystal pulling speed and COP size and density are plotted.

As is evident from FIG. 1, there is a reverse correlation between COP size and COP density in the dependency relationship with the pulling speed. The crystal pulling speed of 0.7 mm/min is the threshold value for the generation of an OSF ring in the wafer surface. At speeds slower than this 0.7 mm/min, dislocation clusters occur in the outer region of the OSF ring, and the size of these dislocation clusters is large.

Embodiment 2

When growing silicon monocrystals having an outer diameter of 8 inches by a CZ method, boron was added, and settings were made to effect a substrate resistance of 2~6 $\Omega \cdot cm$, an oxygen concentration of 13~14 ($\times 10^{17}$ atoms/cm$^3$), and a crystal pulling speed of 0.7 mm/min to produce a condition wherein the outer region of the OSF ring was generated in the wafer surface. Silicon monocrystals were thereupon pulled and grown while controlling the concentration of carbon (an impurity element) to various different values within a range of $0.1 \times 10^{16}$ atoms/cm$^3$ (corresponding to the lower limit of detection) to $12 \times 10^{16}$ atoms/cm$^3$.

Sample wafers cut respectively from prescribed positions in the 8-inch silicon monocrystals pulled at various speeds were subjected to surface grinding, and then polished to a mirror finish on both sides to yield mirror-surface wafers. After finishing and washing the wafers, the surface COP size was measured using the surface contamination inspection instrument (SP-1 made by KLA-Tencor). The results of these measurements are represented in the graph in FIG. 2 wherein the relationship between carbon concentration and COP size is plotted.

Figure 2:
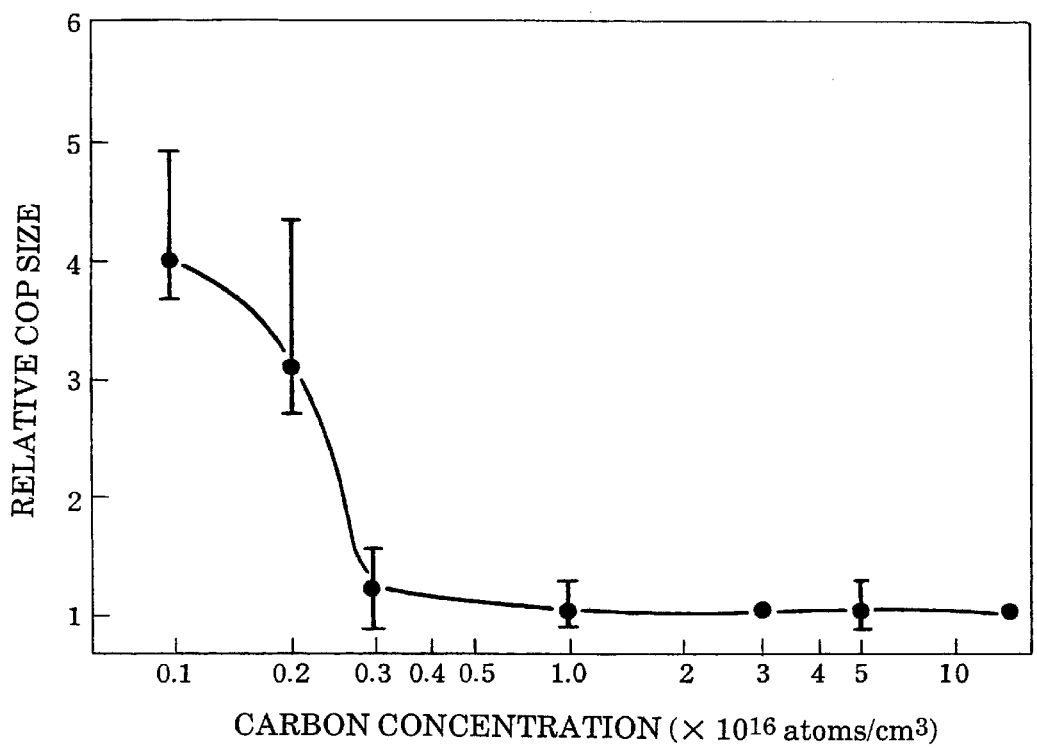
FIG. 2 is a graph plotting the relationship between carbon concentration doping amounts and COP size.

As is evident from FIG. 2, COP size is dependent on the carbon concentration. At carbon concentrations of $0.3 \times 10^{16}$ atoms/cm$^3$ or higher, the COP size diminishes precipitously. The carbon concentration of $0.1 \times 10^{16}$ atoms/cm$^3$ was confirmed by radioactivation analysis to be actually lower by a factor of 10. However, with an FT-IR, the lower limit of measurability is a value of $0.1 \times 10^{16}$ atoms/cm$^3$.

Embodiment 3

Figure 5:
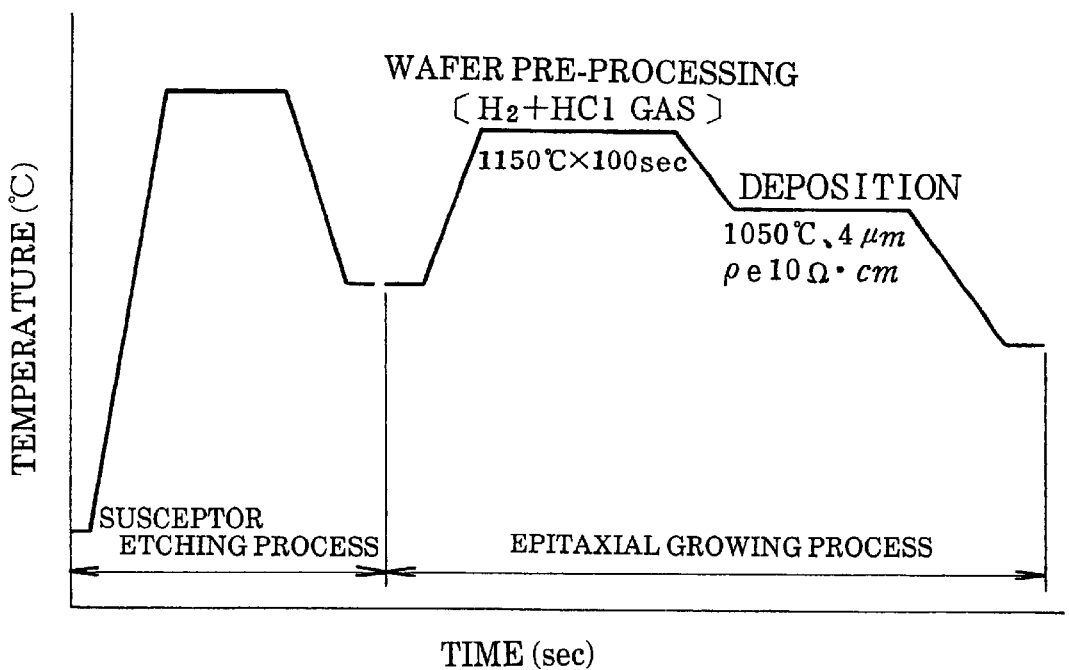
FIG. 5 is a heat pattern diagram representing an epitaxial growth process.

The silicon monocrystal wafers having outer diameters of 8 inches and various carbon concentrations obtained in the embodiment 2 were subjected to epitaxial growth according to the sequence diagrammed in FIG. 5, yielding silicon epitaxial wafers. After finishing and washing these epitaxial wafers, the density of the COP-induced defects (LPDs) generated on the wafer surface was measured with the contamination inspection instrument (SP-1 made by KLA-Tencor). The results of those measurements are plotted in FIG. 3.

Figure 3:
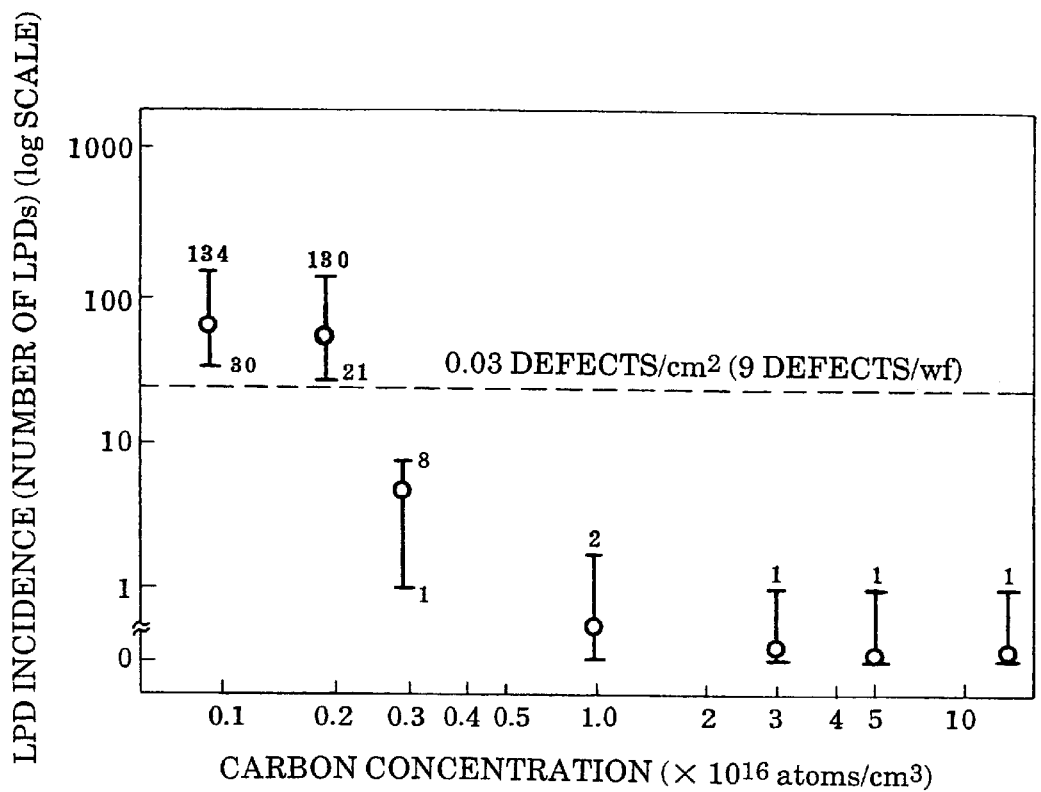
FIG. 3 is a graph plotting the relationship between carbon concentration and the incidence of COP-induced defect LPDs.

As is evident from FIG. 3, when the carbon concentration is $0.3 \times 10^{16}$ atoms/cm$^3$ or higher in the silicon wafers prior to epitaxial growth, the incidence of COP-induced defects (LPDs) generated on the surface after epitaxial growth is 0.03 defects/cm$^2$ or lower.

Embodiment 4

The silicon monocrystal wafers having outer diameters of 8 inches and a carbon concentration of $0.3 \times 10^{16}$ atoms/cm$^3$ obtained in the embodiment 2 were subjected to epitaxial growth as in the embodiment 3, yielding epitaxial wafers.

Using the contamination inspection instrument (SP-1 made by KLA-Tencor) to inspect the wafer surface COPs prior to epitaxial growth and the wafer surface defects (LPDs) after epitaxial growth, the changes in the numbers thereof were measured for each size thereof. The results of these measurements are represented in FIG. 4.

Figure 4:
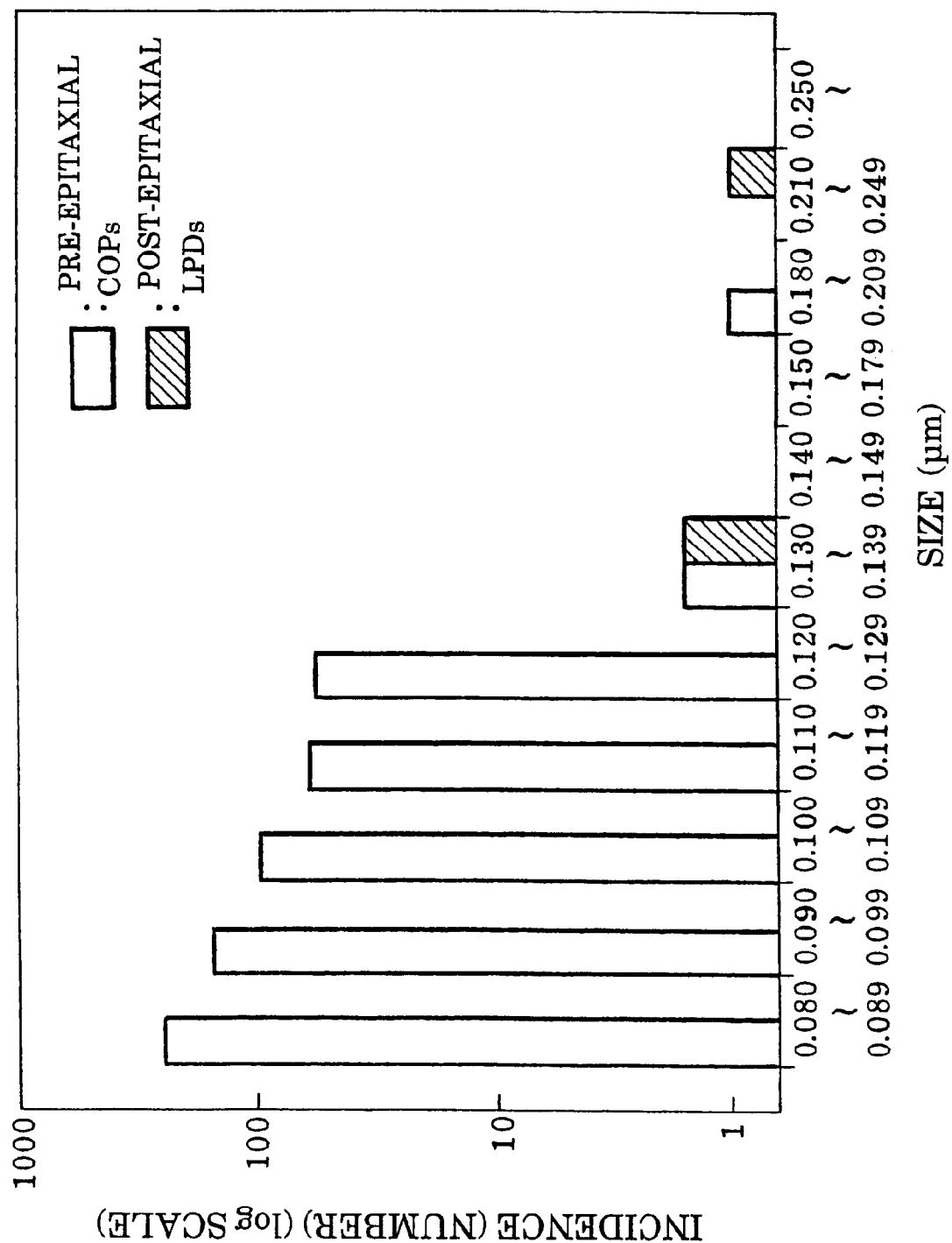
FIG. 4 is a graph showing the generation distribution of COPs and COP-induced defect LPDs before and after the epitaxial growth process.

As is evident from FIG. 4, defects (LPDs) induced by COPs of 0.130 µm or smaller are not present in the wafer surface after epitaxial growth. From this it may be deduced that COPs smaller than 0.130 µm present on the wafer surface prior to epitaxial growth are compressed and eliminated in the process of epitaxial growth. It may also be seen that defects (LPDs) induced by COPs that are 0.130 µm or larger generated in the wafer surface after epitaxial growth are reduced with an extremely high probability.

In the embodiments, only examples involving 8-inch, P-type (B) wafers are described, but it has been confirmed that similar benefits are obtained for 12-inch N-type (P) wafers. In the embodiments described, moreover, the KLA-Tencor SP1 was used for measuring COP and LPD densities, but it has been confirmed that equivalent measurement results can be obtained using other devices such as the AWIS made by AOS if they are calibrated using something like polystyrene laminate (PSL) particles. Also, examples are described wherein the wafer back surfaces are mirror-finished, but it has been confirmed that wafers subjected to only single-side mirror finishing or back-side surface grinding are equivalent.

What is claimed is:

1. A silicon epitaxial wafer manufacturing method comprising:
   a process for preparing silicon monocrystal wafers wherein a density of grown-in defects(COPs) with a size of 0.130 µm or larger is 0.03 defects/cm$^2$ or lower.

2. A silicon epitaxial wafer manufacturing method comprising:
   a process for subjecting silicon monocrystal wafers, wherein a density of grown-in defects(COPs) with a size of 0.130 µm or larger is 0.03 defects/cm$^2$ or lower, to epitaxial growth to eliminate said COPs.

3. A silicon epitaxial wafer manufacturing method comprising:
   a process for growing silicon monocrystals while controlling carbon concentration to within a range of $0.3 \times 10^{16}$ to $3.2 \times 10^{17}$ atoms/cm$^3$ (NEW ASTM); and
   a process for growing silicon monocrystals so that no outer region of an OSF ring is present in wafer surface.

4. A silicon epitaxial wafer manufacturing method comprising:
   a process for growing silicon monocrystals while controlling carbon concentration to within a range of $0.3 \times 10^{16}$ to $3.2 \times 10^{17}$ atoms/cm$^3$ (NEW ASTM);
   a process for growing silicon monocrystals so that no outer region of an OSF ring is present in wafer surface; and
   a process for preparing, after said growing, epitaxial wafers wherein a density of grown-in defects(COPs) with a size of 0.130 µm or larger is 0.03 defects/cm$^2$ or lower.

5. The silicon epitaxial wafer manufacturing method according to claim 4, wherein said silicon monocrystals are grown with a pulling speed wherewith no OSF-ring outer region is present in wafer surface.

* * * * *